United States Patent
Lai et al.

(10) Patent No.: US 12,211,888 B2
(45) Date of Patent: Jan. 28, 2025

(54) METHOD FOR FORMING A THIN FILM RESISTOR WITH IMPROVED THERMAL STABILITY

(71) Applicant: UNITED MICROELECTRONICS CORP., Hsin-Chu (TW)

(72) Inventors: Kuo-Chih Lai, Tainan (TW); Chi-Mao Hsu, Tainan (TW); Shih-Min Chou, Tainan (TW); Nien-Ting Ho, Tainan (TW); Wei-Ming Hsiao, Tainan (TW); Li-Han Chen, Tainan (TW); Szu-Yao Yu, Tainan (TW); Hsin-Fu Huang, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 569 days.

(21) Appl. No.: 17/160,319

(22) Filed: Jan. 27, 2021

(65) Prior Publication Data
US 2022/0238632 A1  Jul. 28, 2022

(51) Int. Cl.
*H01C 17/08* (2006.01)
*H01C 7/00* (2006.01)
*H01L 49/02* (2006.01)

(52) U.S. Cl.
CPC .............. *H01L 28/24* (2013.01); *H01C 7/006* (2013.01); *H01C 17/08* (2013.01)

(58) Field of Classification Search
CPC ......... H01L 28/24; H01C 7/006; H01C 17/08; H01C 17/075
See application file for complete search history.

(56) References Cited

U.S. PATENT DOCUMENTS

| | | | |
|---|---|---|---|
| 3,537,891 A * | 11/1970 | Rairden | H01C 17/08 204/192.1 |
| 6,086,960 A | 7/2000 | Kim | |
| 6,436,819 B1 | 8/2002 | Zhang | |
| 6,555,183 B2 | 4/2003 | Wang | |
| 8,860,181 B2 | 10/2014 | Wei | |
| 9,235,677 B1 | 1/2016 | Chang | |
| 9,240,403 B2 | 1/2016 | Hung | |
| 9,401,358 B1 | 7/2016 | Hung | |
| 9,466,521 B2 | 10/2016 | Lin | |
| 10,276,648 B1 * | 4/2019 | Liu | H01L 28/24 |
| 2007/0008062 A1 * | 1/2007 | Fivas | H01C 7/006 257/E21.004 |
| 2009/0317972 A1 * | 12/2009 | Anderson | H01L 28/24 257/E21.585 |
| 2012/0049997 A1 * | 3/2012 | Lim | H01L 23/5228 338/308 |
| 2013/0075683 A1 * | 3/2013 | Fowler | G11C 13/0007 257/2 |
| 2018/0026031 A1 | 1/2018 | Chen | |
| 2018/0083090 A1 * | 3/2018 | Yang | H01L 28/24 |

* cited by examiner

*Primary Examiner* — Michael Jung
(74) *Attorney, Agent, or Firm* — Winston Hsu

(57) ABSTRACT

A method for forming a thin film resistor with improved thermal stability is disclosed. A substrate having thereon a first dielectric layer is provided. A resistive material layer is deposited on the first dielectric layer. A capping layer is deposited on the resistive material layer. The resistive material layer is then subjected to a thermal treatment at a pre-selected temperature higher than 350 degrees Celsius in a hydrogen or deuterium atmosphere. The capping layer and the resistive material layer are patterned to form a thin film resistor on the first dielectric layer.

9 Claims, 2 Drawing Sheets

METHOD FOR FORMING A THIN FILM RESISTOR WITH IMPROVED THERMAL STABILITY

BACKGROUND OF THE INVENTION

1. Field of the Invention

The present disclosure relates to semiconductor technology. More particularly, the present disclosure relates to a method for forming a thin film resistor with improved thermal stability.

2. Description of the Prior Art

Integrated circuits and thin film devices frequently require resistors as part of the circuitry, and thin film resistors are commonly used. Thin film resistors generally consist of a thin film of resistive material deposited on a layer or substrate of insulative material with end contacts on the resistive material. The end contacts or interconnections are then connected to circuit components in conventional manner.

It is desirable that a thin film resistor have a target or intended resistance commonly expressed as sheet resistance in ohms per square. Further, it is normally desirable that a thin film resistor have a very low temperature coefficient of resistance, or at least a temperature coefficient of resistance that is suitably matched to a particular application.

As is known, raising the temperature of a thin film resistor normally forms a crystalline structure and the sheet resistance decreases. Therefore, it may be necessary to provide a higher than desired sheet resistance knowing that it will decrease during subsequent thermal processing. There is still a need in this industry to provide a thin film resistor with high thermal stability and a method of making the same.

SUMMARY OF THE INVENTION

The invention provides an improved method for forming a thin film resistor that presents stable sheet resistance throughout the back-end metal interconnection process.

According to one aspect of the present disclosure, a method for forming a thin film resistor with improved thermal stability is disclosed. A substrate having thereon a first dielectric layer is provided. A resistive material layer is deposited on the first dielectric layer. A capping layer is deposited on the resistive material layer. The resistive material layer is then subjected to a thermal treatment at a pre-selected temperature higher than 350 degrees Celsius in a hydrogen or deuterium atmosphere, thereby forming a treated resistive material layer. The capping layer and the treated resistive material layer are patterned to form a thin film resistor on the first dielectric layer.

According to some embodiments, after patterning the capping layer and the treated resistive material layer to form the thin film resistor on the first dielectric layer, a second dielectric layer is deposited on the thin film resistor and the first dielectric layer.

According to some embodiments, the first dielectric layer comprises silicon oxide or silicon oxycarbide.

According to some embodiments, the second dielectric layer comprises silicon oxide or silicon oxycarbide.

According to some embodiments, after the second dielectric layer is deposited on the thin film resistor and the first dielectric layer, a contact is formed in the second dielectric layer and the capping layer to electrically connect to the resistive material layer.

According to some embodiments, the resistive material layer comprises titanium nitride, tantalum nitride, tantalum, silicon chromium, or combinations thereof.

According to some embodiments, the capping layer comprises a silicon nitride layer.

According to some embodiments, the capping layer is a bi-layered capping layer comprising a silicon nitride bottom layer and a silicon oxide top layer.

According to some embodiments, the pre-selected temperature ranges between 350-460 degrees Celsius.

According to some embodiments, the thermal treatment is performed in a furnace at a pressure of about 600 Torr to 40 atm for a time period of about 1-10 hours.

According to some embodiments, the thermal treatment is performed in a chemical vapor deposition (CVD) chamber at a pressure of about 1-30 Torr for a time period of about 1-20 minutes with a flowrate of hydrogen or deuterium ranging between 200-3000 sccm and a radiofrequency (RF) bias power of about 100-3000 W.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
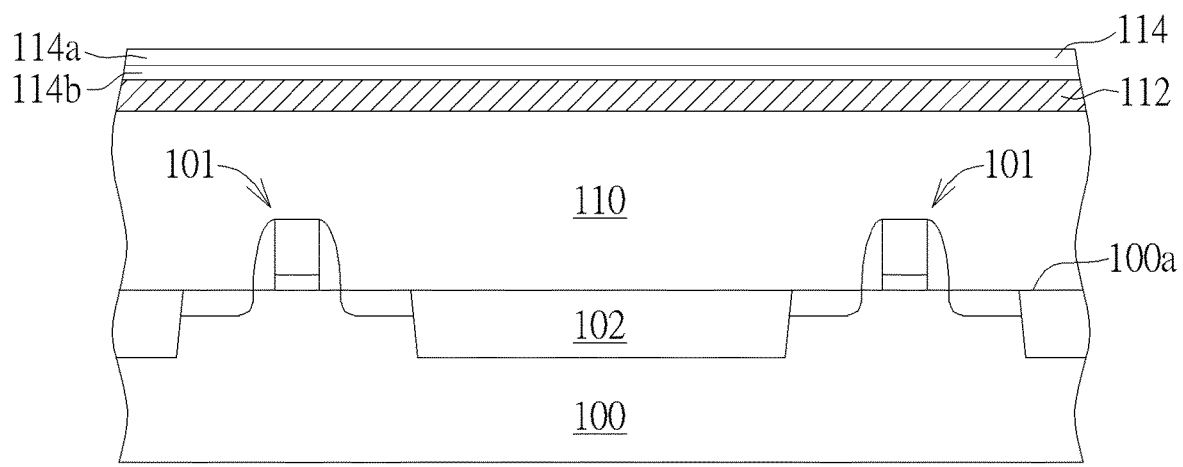
FIG. 1 to FIG. 4 are schematic, cross-sectional diagrams showing an exemplary method for forming a thin film resistor with improved thermal stability according to one embodiment of the invention.

Advantages and features of embodiments may be understood more readily by reference to the following detailed description of preferred embodiments and the accompanying drawings. Embodiments may, however, be embodied in many different forms and should not be construed as being limited to those set forth herein. Rather, these embodiments are provided so that this disclosure will be thorough and complete and will fully convey exemplary implementations of embodiments to those skilled in the art, so embodiments will only be defined by the appended claims. Like reference numerals refer to like elements throughout the specification.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

FIG. 1 to FIG. 4 are schematic, cross-sectional diagrams showing an exemplary method for forming a thin film resistor with improved thermal stability according to one embodiment of the invention. As shown in FIG. 1, first, a substrate 100 such as a silicon substrate is provided. On the major surface 100a of the substrate 100, a plurality of semiconductor circuit elements 101 such as metal-oxide-semiconductor (MOS) field effect transistors may be provided. Shallow trench isolation (STI) regions 102 may be formed in the substrate 100 to electrically isolate the semiconductor circuit elements 101 from one another, but is not limited thereto. An inter-layer dielectric (ILD) layer 110 may be deposited on the substrate 100. For example, the ILD layer 110 may be formed by using chemical vapor deposition (CVD) methods, but not limited thereto. For example, the ILD layer 110 may comprise silicon oxide, borosilicate glass (BSG), borophosphosilicate glass (BPSG), or silicon oxycarbide, but is not limited thereto.

According to an embodiment of the invention, a resistive material layer 112 is then deposited on the ILD layer 110 in a blanket manner. According to some embodiments, the resistive material layer 112 may comprise titanium nitride (TiN), tantalum nitride (TaN), tantalum (Ta), silicon chromium (SiCr), or combinations thereof. According to some embodiments, for example, the resistive material layer 112 comprises amorphous titanium nitride. According to an embodiment of the invention, after depositing the resistive material layer 112, a capping layer 114 is deposited on the resistive material layer 112 in a blanket manner. According to an embodiment, the capping layer 114 may comprise a silicon nitride layer. According to an embodiment, for example, the capping layer 114 is a bi-layered capping layer comprising a silicon nitride bottom layer 114b and a silicon oxide top layer 114a.

Figure 2:
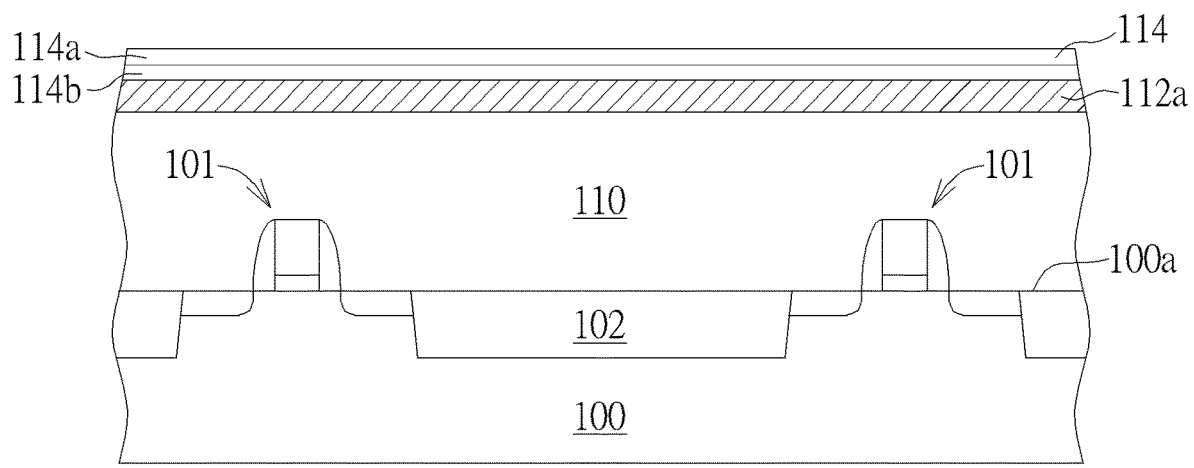

As shown in FIG. 2, after forming the capping layer 114, the resistive material layer 112 is then subjected to a thermal treatment (or $H_2$ soaking) P at a pre-selected temperature that is higher than 350 degrees Celsius in a hydrogen or deuterium atmosphere, thereby forming a treated resistive material layer 112a. According to an embodiment, for example, the pre-selected temperature ranges between 350-460 degrees Celsius. According to an embodiment, the thermal treatment P may be performed in a furnace at a pressure of about 600 Torr to 40 atm for a time period of about 1-10 hours. According to an embodiment, the thermal treatment P may be performed in a chemical vapor deposition (CVD) chamber at a pressure of about 1-30 Torr for a time period of about 1-20 minutes with a flowrate of hydrogen or deuterium ranging between 200-3000 sccm and a radiofrequency (RF) bias power (AC, pulsed DC or DC) of about 100-3000 W.

According to an embodiment, the hydrogen or deuterium species used during the thermal treatment P may reduce oxidation and increase the grain growth of the resistive material layer 112. According to an embodiment, an average grain size of the treated resistive material layer 112a is greater than that of the resistive material layer 112.

Figure 3:
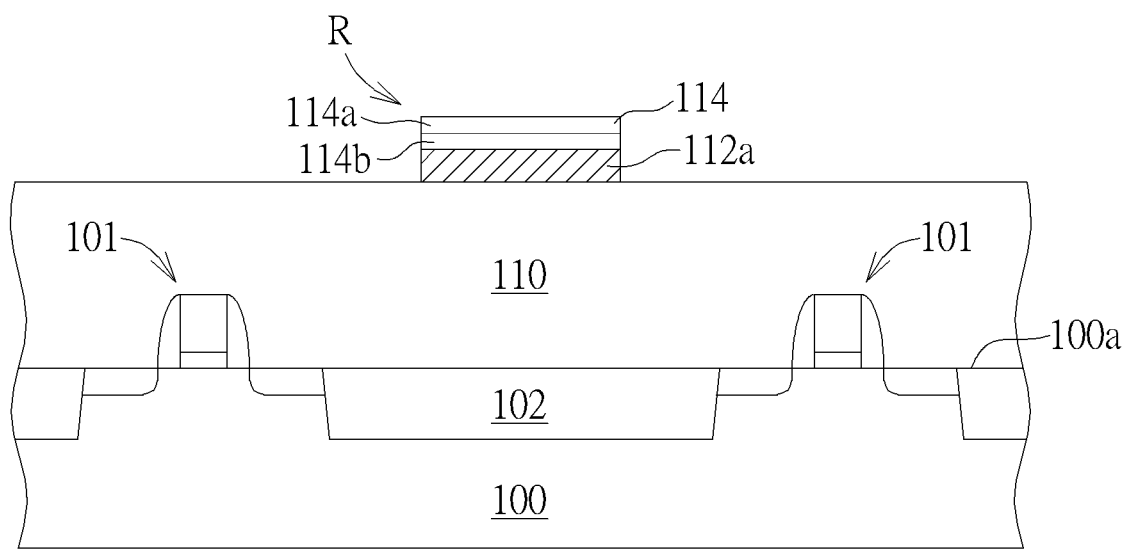

As shown in FIG. 3, after the thermal treatment P is completed, a lithographic process and an etching process are performed to pattern the capping layer 114 and the treated resistive material layer 112a into a thin film resistor R on the ILD layer 110. The dimension (e.g., length or width) of the thin film resistor R may depend upon the sheet resistance $R_S$ that is required in the integrated circuit.

Figure 4:
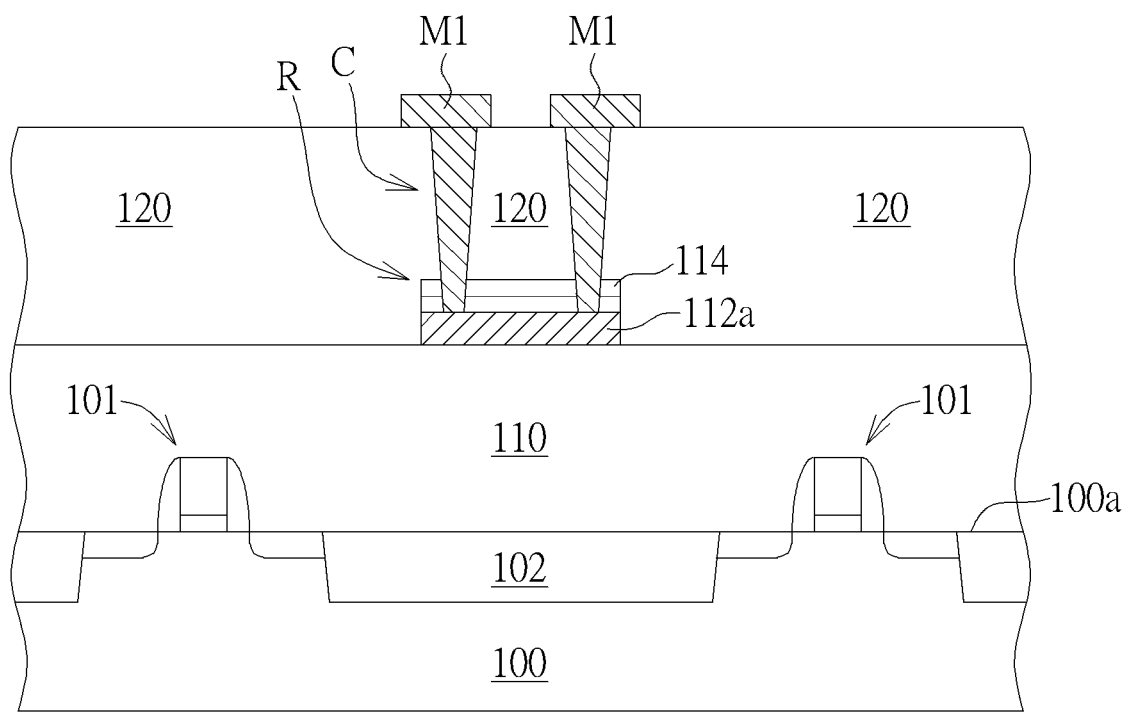

As shown in FIG. 4, after patterning the capping layer 114 and the treated resistive material layer 112a to form the thin film resistor R on the ILD layer 120, an inter-layer dielectric (ILD) layer 120 is deposited on the thin film resistor R and the ILD layer 110. According to an embodiment, for example, the ILD layer 120 may comprise silicon oxide, but not limited thereto. According to an embodiment, after the ILD layer 120 is deposited on the thin film resistor R and the ILD layer 110, at least a contact C is formed in the ILD layer 120 and the capping layer 114 to electrically connect to the treated resistive material layer 112a. Subsequently, a first metal interconnect layer M1 may be formed on the contact C and on the ILD layer 120.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for forming a thin film resistor with improved thermal stability, comprising:
    providing a substrate having thereon a first dielectric layer;
    depositing a resistive material layer on the first dielectric layer;
    forming a capping layer on the resistive material layer;
    after forming the capping layer on the resistive material layer, subjecting the resistive material layer to a thermal treatment at a pre-selected temperature higher than 350 degrees Celsius in a deuterium atmosphere, thereby forming a treated resistive material layer, wherein the capping layer is a bi-layered capping layer comprising a silicon nitride bottom layer and a silicon oxide top layer; and
    patterning the capping layer and the treated resistive material layer to form a thin film resistor on the first dielectric layer.

2. The method according to claim 1, wherein after patterning the capping layer and the treated resistive material layer to form the thin film resistor on the first dielectric layer, the method further comprises:
    depositing a second dielectric layer on the thin film resistor and the first dielectric layer.

3. The method according to claim 2, wherein the first dielectric layer comprises silicon oxide or silicon oxycarbide.

4. The method according to claim 3, wherein the second dielectric layer comprises silicon oxide or silicon oxycarbide.

5. The method according to claim 2, wherein after depositing the second dielectric layer on the thin film resistor and the first dielectric layer, the method further comprises:
    forming a contact in the second dielectric layer and the capping layer to electrically connect to the treated resistive material layer, wherein the contact penetrates through the silicon oxide top layer and the silicon nitride bottom layer.

6. The method according to claim 1, wherein the resistive material layer comprises titanium nitride, tantalum nitride, tantalum, silicon chromium, or combinations thereof.

7. The method according to claim 1, wherein the pre-selected temperature ranges between 350-460 degrees Celsius.

8. The method according to claim 1, wherein the thermal treatment is performed in a furnace at a pressure of about 0.7895 atm to 40 atm for a time period of about 1-10 hours.

9. The method according to claim 1, wherein the thermal treatment is performed in a chemical vapor deposition (CVD) chamber at a pressure of about 1-30 Torr for a time period of about 1-20 minutes with a flowrate of hydrogen or deuterium ranging between 200-3000 sccm and a radiofrequency (RF) bias power of about 100-3000 W.

* * * * *